United States Patent

Taniguchi

[11] Patent Number: 5,295,112
[45] Date of Patent: Mar. 15, 1994

[54] SEMICONDUCTOR MEMORY

[75] Inventor: Kazutaka Taniguchi, Kanagawa, Japan

[73] Assignee: NEC Corporation, Tokyo, Japan

[21] Appl. No.: 964,848

[22] Filed: Oct. 22, 1992

[30] Foreign Application Priority Data

Oct. 30, 1991 [JP] Japan .................. 3-284330

[51] Int. Cl.$^5$ ............................ G11C 11/40
[52] U.S. Cl. ................... 365/227; 365/226; 365/189.01; 365/230.01
[58] Field of Search ............ 365/226, 227, 189.01, 365/230.01

[56] References Cited

U.S. PATENT DOCUMENTS 4,953,127 8/1990 Nagahashi et al. ............ 365/226

Primary Examiner—Terrell W. Fears
Attorney, Agent, or Firm—Laff, Whitesel Conte & Saret

[57] ABSTRACT

A high-speed low-power semiconductor memory comprises a stand-by mode determination circuit for monitoring the internal power source voltage from the voltage drop circuit. The voltage drop circuit comprises an active driver circuit and a stand-by driver circuit as well as an compensating driver circuit. The compensating driver circuit compensates, in response to an output of the stand-by mode determination circuit, for an increase of the internal circuit current. Further, since reduction of internal power source voltage which tends to occur at that time is prevented, the semiconductor memory of this invention can operate stably at high speed.

6 Claims, 2 Drawing Sheets

SEMICONDUCTOR MEMORY

BACKGROUND OF THE INVENTION

1. Field of the Invention

The present invention relates to a semiconductor memory and, particularly, to a single chip semiconductor memory having a voltage drop circuit for stepping an externally supplied source voltage down to a source voltage for an internal circuit of the memory.

2. Description of the Prior Art

It has been known that a single chip semiconductor memory having large memory capacity includes a voltage drop circuit for stepping an externally supplied source voltage down to a voltage to be used as a source voltage for an internal circuit of the memory. Such voltage drop circuit should have a construction capable of keeping an increase of power consumption thereby minimum. One of schemes for realizing such requirement is disclosed in Japanese Patent JPA 2-195596.

A semiconductor memory disclosed therein is equipped with a voltage drop circuit including a pair of parallel connected driver circuits which have a common output terminal and have different current supply capabilities. One of the driver circuits, that is, the so-called stand-by driver circuit, is operative in both stand-by and active modes of the memory. However, since the stand-by driver circuit is enough to supply only current flowing through a whole internal circuit in stand-by mode of the memory (referred to as "stand-by internal circuit current", hereinafter), its current supply capability and hence its power consumption is small. On the other hand, the other driver circuit, that is, the so-called active driver circuit, is operative in the active mode of memory and has to supply maximum current of the internal circuit in that mode. Therefore, its current supply capability and hence power consumption is larger correspondingly. The active driver circuit is inoperative in the stand-by mode, so that power consumption of the whole memory is reduced, allowing high integration density and large memory capacity.

However, when the above memory is constructed with CMOS's, the reduced power consumption causes read/write speed to be lowered. This problem tends to occur when a signal input stage of the memory is constructed with a CMOS inverter. As well known, such CMOS inverter consumes power in only a transient period of an input signal and, therefore, its power consumption is very small. However, when the input signal is a TTL level signal from a TTL, a large current flows through the CMOS inverter even when the signal is a DC signal. Further, when the signal is a MOS level signal, current proportional to a frequency of on-off switching thereof flows therethrough.

Therefore, when the input signal to the semiconductor memory is the TTL level signal or when, although the input signal is a MOS level signal, it repeats on-off switching as in the case of an input signal to a memory device which includes a plurality of identical memories connected in parallel to each other in order to increase its memory capacity and which is, in stand-by mode, a large current flows in the signal input stage thereof and the stand-by internal circuit current substantially increases even if the memory device is in stand-by mode. For example, for an SRAM of 4 M bits size, the stand-by internal circuit current which is usually in the order of several tens μA could become several tens mA.

Since, however, the current supply capability of the stand-by driver circuit of the memory disclosed in the aforementioned prior art is limited as mentioned, such substantial increase of the stand-by internal circuit current makes an output voltage of the stand-by driver circuit, that is, an internal power source voltage of the memory chip, lower substantially. As a result, there may be failure of memory content of memory cells and/or failure of read/write speed due to delay of recovery of the internal power source voltage when the operation mode is switched from stand-by mode to active mode. In order to avoid the above mentioned failures without limiting selectivity of circuit to which the memory chip is to be connected, it might be possible to preliminarily design current supply capability of the stand-by driver circuit large enough to accomodate a possible increase of current in the signal input stage thereof. In such case, however, power consumption of the stand-by driver circuit itself will be substantially increased.

Another approach for avoiding the above mentioned failures might be to provide the so-called power-cut function in the input stage of the internal circuit. That is, an operation of the input stage is inhibited in synchronism with a start control signal of the memory such as an RAS signal of a DRAM or a CS (chip select) signal of an SRAM to cut off a signal input to thereby restrict i of the stand-by internal circuit current. The power-cut function, however, must be stopped in a period in which the memory mode is shifted from stand-by mode to active mode. Therefore, the read/write operation of the memory is substantially delayed in such period.

BRIEF DESCRIPTION OF THE INVENTION

Object of the Invention

Therefore, an object of the present invention is to provide a high integration density/large storage capacity semiconductor memory of low power consumption without degradation of write/read speed and without degradation of freedom of selection of circuit to be connected while having no dependency on the power cut function.

Summary of the Invention

A semiconductor memory according to the present invention comprises a single chip semiconductor memory including a voltage drop circuit for stepping an externally supplied power source voltage down to an internal power source voltage for the memory chip and is featured by that a stand-by mode determination circuit for monitoring the internal power source voltage is provided and that the voltage drop circuit includes an active driver circuit for providing a maximum operation internal circuit current in active mode of the memory chip, a stand-by driver circuit for providing a stand-by internal circuit current in stand-by mode of the memory chip and a compensating driver circuit controlled by the stand-by mode determination circuit for compensating for an increase of the stand-by internal circuit current of the memory chip in stand-by mode.

The stand-by mode determination circuit compares a predetermined reference value of the internal power source voltage with an actual internal power source voltage and makes the compensating driver circuit active only when the internal power source voltage in stand-by mode becomes lower than the reference value. The compensating driver circuit is adapted to compensate for increase of the stand-by internal circuit current to thereby recover the internal power source voltage to the reference value.

In the semiconductor memory according to the present invention, the internal power source voltage is prevented from being lowered without using the power-cut function. Therefore, power consumption can be reduced and write/read speed is prevented from being lowered. Further, there is no limitation of selection of circuit to be connected to the memory chip.

BRIEF DESCRIPTION OF THE DRAWINGS

The above-mentioned and other objects, features and advantages of the present invention will become more apparent by reference to the following detailed description of the present invention taken in conjunction with the accompanying drawings wherein.

DETAILED DESCRIPTION OF THE INVENTION

Figure 1:
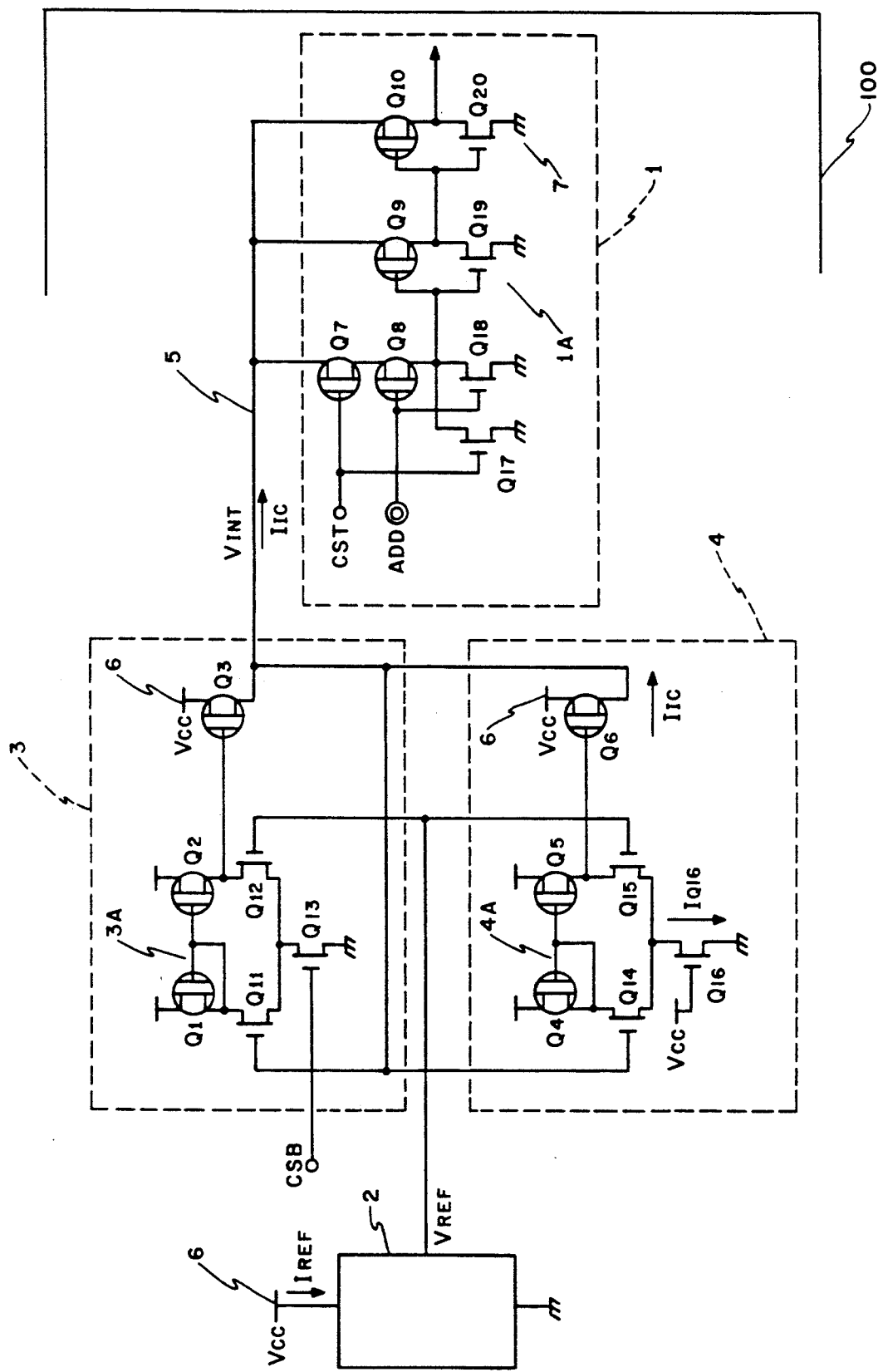
FIG. 1 is a circuit diagram of a portion of a conventional SRAM, that is, a voltage drop circuit and an address buffer circuit.

In order to facilitate a full understanding of the present invention, a portion of the conventional SRAM disclosed in the aforementioned prior art corresponding to the present invention will be referred to. Referring to FIG. 1, the portion of the SRAM 100 corresponding to the present invention includes an internal circuit 1 and a voltage drop circuit for generating a power source voltage $V_{INT}$ for driving the internal circuit 1, both of which are mounted on a common chip. The voltage drop circuit is composed of a reference voltage generator circuit 2, an active driver circuit 3 and a stand-by driver circuit 4.

The internal circuit 1 includes, in addition to an address buffer circuit 1A, circuits responsive to signals supplied externally of the chip, such as control circuits responsive to a control signal such as chip enable (select) signal, write enable signal and output enable signal, data input buffer circuit, and circuits responsive to signals generated within the chip, such as memory cell array, address decoder, sense circuit and data output circuit. These circuits, except the output buffer circuit, are operated with voltage $V_{INT}$ (referred to as internal power source voltage, hereinafter) supplied from an internal power source line 5. Among these circuits, related to the present invention is a circuit which receives an external signal as its input. In FIG. 1, an address buffer circuit is shown as an example of such circuit.

The active driver circuit 3 and the stand-by driver circuit 4 take in the form of variable conductance elements inserted between an external power source line (voltage Vcc) 6 and an internal power source line (voltage $V_{INT}$) 5, respectively, and function to step-down the external power source voltage Vcc to the internal power source voltage $V_{INT}$. That is, the active driver circuit 3 includes a P channel MOS transistor Q3 having a source electrode connected to the external power source line 6 and a drain electrode connected to the internal power source line 5 and a current mirror load type differential amplifier circuit 3A for controlling a gate voltage of the transistor Q3. The differential amplifier circuit 3A amplifies a difference voltage between the internal power source voltage $V_{INT}$ and a reference voltage $V_{REF}$ from the reference voltage generator circuit 2, supplies it to a gate electrode of the transistor Q3 to change its conductance and controls the latter thereby such that the internal power source voltage $V_{INT}$ is always equal to the reference voltage $V_{REF}$. Similarly, the stand-by driver circuit 4 includes a P channel MOS transistor Q6 having a source electrode connected to the external power source line 6 and a drain electrode connected to the internal power source line 5 and a differential amplifier 4A for controlling a gate voltage of the transistor Q6 and makes the voltage V equal to the voltage V by controlling conductance of the transistor Q6 by means of an output of the differential amplifier circuit 4A.

The stand-by driver circuit 4 is always operative and is supplying a stand-by internal circuit current during a stand-by mode period of the SRAM 100. In this period, the gate voltage supplied from the differential amplifier circuit 4A is such that the conductance of the transistor Q6 is increased. In the active driver circuit 3, when a control signal CSB generated within the chip in synchronism with an externally supplied chip enable (select) signal (not shown) is activated, that is, when the SRAM 100 enters into active mode, an N channel MOS transistor Q13 of the differential amplifier circuit 3A is turned on to control the gate voltage of the transistor Q3 so that its conductance increases and the transistor Q3 supplies an operating internal circuit current in parallel to the driver circuit 4 in the active mode.

The internal circuit 1 includes in its first input stage a CMOS 2-input NOR gate composed of two P channel MOS transistors Q7 and Q8 and two N channel MOS transistors Q17 and Q18. To two inputs of the 2-input NOR gate, an address signal ADD supplied externally of the chip and a control signal CST generated within the chip are supplied respectively. The control signal CST and the control signal CSB are in logically inverted relation to each other. The 2-input NOR gate in the first input stage provides a power cut function of preventing increase of current consumption (stand-by internal circuit current) of the internal circuit 1 and hence preventing decrease of the internal power source voltage $V_{INT}$ caused thereby to the internal circuit 1 when the input address signal ADD in stand-by mode is a TTL level signal or MOS level on/off switching signal. Describing this in more detail, the control signal CST supplied to the 2-input NOR gate in the first input stage is H (high level) in stand-by mode. Therefore, the P channel MOS transistor Q7 and the N channel MOS transistor Q17 are turned off and on, respectively. Thus, an output of the 2-input NOR gate is fixed to L (low level) regardless of level of the address signal ADD and, so, there is no change of current in the internal circuit 1. Therefore, even if the current supply capability of the stand-by driver circuit 4 is small, the internal power source voltage $V_{INT}$ can be maintained at the reference voltage $V_{REF}$.

In stand-by mode of the SRAM 100, a total current supplied to the chip from the external power source circuit, that is, the stand-by power source current, is a sum of current (stand-by internal circuit current) $I_{IC}$ flowing through the whole internal circuit including a memory array (not shown), current (drain current of N channel MOS transistor Q16) $I_{Q16}$ flowing through a circuit other than the internal circuit, that is, the differential amplifier circuit 4A of the stand-by driver circuit 4 and current $I_{REF}$ consumed by the reference voltage generator circuit 2. For example, in a case where the SRAM 100 is a 4M bits SRAM operating at the internal power source voltage $V_{INT}$ of 4V, the above mentioned currents are: $I_{IC}$=0.01 mA, $I_{Q16}$=0.3 mA, $I_{REF}$=0.5 mA and the stand-by power source current is about 0.8 mA. Due to this power-cut function, the internal circuit consumes substantially no current $I_{IC}$ regardless of whether the input signal is TTL level signal, switching MOS level signal (stand-by mode under this condition will be referred to as ISB mode) or a DC MOS level signal (stand-by mode under this condition will be referred to as ISB1 mode), and a major portion of the stand-by power source current is current ($I_{Q16}$+$I_{REF}$) flowing through the voltage divider circuit. As such, the construction of the voltage divider circuit largely affects the value of the stand-by power source current which determines power consumption of the whole SRAM in stand-by mode.

Figure 2:
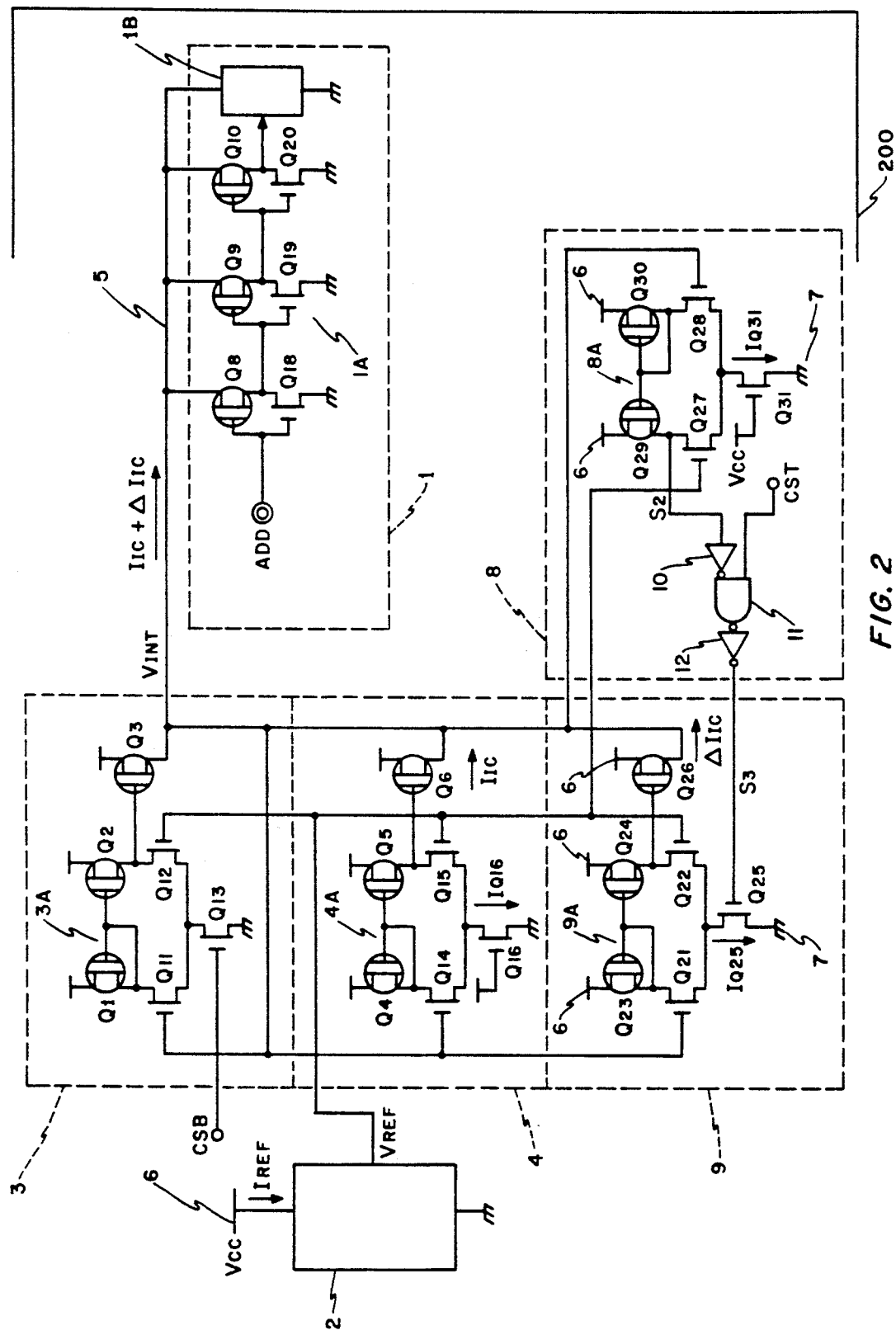
FIG. 2 is a circuit diagram of a portion of an SRAM according to an embodiment of the present invention corresponding to FIG. 1.

FIG. 2 shows a 4M bits SRAM 200 constructed according to an embodiment of the present invention in which same or similar constructive components to those shown in FIG. 1 are depicted by same reference numerals, respectively. In FIG. 2, the embodiment is featured compared with the memory shown in FIG. 1 by having a stand-by mode determination circuit 8 and a compensating driver circuit 9. Further, the power-cut function given to the internal circuit 1 in FIG. 1 is removed. The SRAM 200 steps-down an external power source voltage of 5V to an internal power source voltage. Although such internal power source voltage of 3.3 V is known, the internal power source voltage in this embodiment is set to 4 V in view of high speed operation.

Constructions and current supply capabilities of an active driver circuit 3 and a stand-by driver circuit 4 are the same as those of the driver circuits 3 and 4 of the conventional SRAM 100 shown in FIG. 1.

Since a P channel MOS transistor Q3 of the active driver circuit 3 must supply the maximum operating internal circuit current as large as about 200 mA when the SRAM is in active mode, its gate width is selected as large as 20 mm. On the other hand, since a P channel MOS transistor Q6 of the stand-by driver circuit 4 is enough to supply a maximum stand-by internal circuit current when the SRAM 200 is in ISB1 mode, which is as small as 0.3 mA or smaller, its gate width is selected as small as about 0.2 mm. The SRAM 200 is designed such that current $I_{Q16}$ of 0.3 mA always flows through the transistor Q16 of a differential amplifier circuit 4A.

The compensating driver circuit 9 has a similar construction to that of the driver circuit 3 or 4. That is, a differential amplifier circuit 9A of the compensating driver circuit 9 is composed of a pair of N channel MOS transistors Q21 and Q22 having source electrodes connected to each other. A pair of P channel MOS transistors Q23 and Q24 are provided between drain electrodes of the transistors Q21 and Q22 and an external power source line 6. A gate electrode of the transistor Q23 is connected to its drain electrode and to a gate electrode of the transistor Q24, so that the transistors Q23 and Q24 form a current mirror circuit which functions as an active load for the transistors Q21 and Q22. An N channel MOS transistor Q25 is provided as a current source between a junction of the source electrodes of the transistors Q21 and Q22 which form a differential transistor pair and a ground line 7. A gate electrode of the transistor Q25 is connected to an output terminal of the standby mode determination circuit 8. A reference voltage $V_{REF}$ generated by the reference voltage generator circuit 2 is applied to the gate electrode of the transistor Q22 and a voltage $V_{INT}$ of the internal power source line 5 is applied to the gate electrode of the transistor Q21. These transistors connected as mentioned above constitute the differential amplifier circuit 9A which compares the internal power source voltage $V_{INT}$ with the reference voltage $V_{REF}$ and amplifies a difference therebetween, a result being output from the drain electrode of the transistor Q22.

The output of the differential amplifier circuit 9A is supplied to a gate electrode of a P channel MOS transistor Q26 having source electrode and a drain electrode connected to the external power source line 6 and the internal power source line 5, respectively. A conductance of the transistor Q26 is set to a large value so that it can compensate for an increment $\Delta I_{IC}$ of the stand-by internal circuit current. In this embodiment, the increment $\Delta I_{IC}$ of the stand-by internal circuit current is estimated as 20 mA upon which the gate width of the transistor Q26 is set as 2 mm. The compensating driver circuit 9 is activated when a control signal S3 from the standby mode determination circuit 8 is in H (high) level to cause a current $I_{Q26}$ of 3.4 mA to flow into the N channel MOS transistor Q25 which is the current source for the differential amplifier circuit 9A.

The standby mode determination circuit 8 comprises a differential amplifier circuit 8A for amplifying a voltage difference between the internal power source voltage $V_{INT}$ and the reference voltage $V_{REF}$, a 2-input NAND gate 11 supplied with a control signal CST and an output signal S2 of the differential amplifier circuit 8A inverted by an inverter 10 and an inverter 12 for inverting an output of the 2-input NAND gate 11 and supplying it to the gate electrode of the N channel MOS transistor Q25 of the compensating driver circuit 9 as a control signal S3. The differential amplifier circuit 8A includes a pair of N channel MOS transistors Q27 and Q28 having source electrodes connected to each other and a pair of P channel MOS transistors Q29 and Q30 are provided between drain electrodes of the transistors Q27 and 28 and the external power source line 6. A gate electrode of the transistor Q29 is connected to its drain electrode and a gate electrode of the transistor Q29. The transistors Q29 and Q30 constitute a current mirror circuit which is an active load for the transistors Q27 and Q28. An N channel MOS transistor Q31 is inserted between a common junction of the source electrodes of the transistors Q27 and Q28 and the ground line 7. The transistor Q31 is supplied at a gate electrode thereof with an external power source voltage Vcc and functions as a current source for the differential amplifier circuit 8A. The reference voltage $V_{REF}$ is applied to the gate electrode of the transistor Q27 and the voltage $V_{INT}$ of the internal power source line 5 is applied to the gate electrode of the transistor Q28. The differential amplifier circuit 8A amplifies a difference between the voltages $V_{REF}$ and $V_{INT}$ and outputs a control signal S2 from the drain electrode of the transistor Q27 thereof.

Although the stand-by mode determination circuit 8 uses the differential amplifier circuit similarly to the driver circuits 3, 4 and 9, a current $I_{Q31}$ flowing through the N channel MOS transistor Q31 as the current source of the differential amplifier circuit 8A is as small as about 0.1 mA.

A first input stage of the internal circuit 1 is constituted with a CMOS inverter composed of a P channel MOS transistor Q8 and an N channel MOS transistor Q18. An output of the first input stage is level-converted by a second input stage constituted with a CMOS inverter composed of a P channel MOS transistor Q8 and an N channel MOS transistor Q18, waveshaped by a third input stage constituted with a CMOS inverter composed of a P channel MOS transistor Q10 and an N channel MOS transistor Q20 and then supplied to an address decoder 1B. All of these CMOS inverters of the internal circuit 1 are driven by the internal power source voltage $V_{INT}$. In this embodiment, since there is no current flowing through the internal circuit except only about 0.01 mA flowing through a cell array in ISB1 mode, the stand-by internal circuit current Iic can be estimated as substantially 0 mA. On the other hand, in ISB mode, the standby internal circuit current is increased to about 20 mA ($=I_{IC+\Delta IIC}$).

In the SRAM 200 shown in FIG. 2, when the control signal CSB synchronized with the chip enable (select) signal is in H (high) level, the SRAM is in active mode. That is, when the input control signal to the gate electrode of the transistor Q13 of the active driver circuit 3 becomes H level, the driver circuit 3 is activated to step the external power source voltage Vcc of 5V down to 4V and supplies it to the internal power source line 5 as the internal power source voltage $V_{INT}$. On the other hand, since the control signal CST input to one of the inputs of the 2-input NAND gate 11 is in L (low) level, the stand-by mode determination circuit 8 outputs the control signal S3 which is in L level. Therefore, the compensating driver circuit 9 does not become activated regardless of level of the output control signal S2 of the differential amplifier circuit 8A, that is, regardless of difference between the internal power source voltage $V_{INT}$ and the reference voltage $V_{REF}$.

As mentioned above, when the SRAM 200 is in active mode, the stand-by mode determination circuit 8 controls the compensating driver circuit 9 such that the latter is always kept in non-activated state. Therefore, the compensating driver circuit 9 does not consume any current ($I_{Q25}=0$). The current supply source of the internal power source line 5 in active mode includes the active driver circuit 3 and the stand-by driver circuit 4 and power consumption of the whole chip in this state is substantially the same as that of the SRAM 100 (FIG. 1) having power-cut function.

When the control signal CSB becomes L level and so the SRAM 200 becomes in stand-by mode, the gate electrode of the transistor Q13 of the active driver circuit 3 becomes L level. Therefore, the operation of the active driver circuit 3 is terminated, consuming no power. A current supply source to the internal power source line 5 in stand-by mode includes mainly the standby driver circuit 4. However, when the address signal ADD is in ISB mode, the compensating driver circuit 9 also supplies current as to be described below.

When the address signal ADD is a DC signal of MOS level (ISB1 mode), current flows through neither of the CMOS inverters of the internal circuit 1. Therefore, there is no variation of the stand-by internal circuit current of the SRAM 200 caused by the address signal ADD and thus the stand-by internal circuit current $I_{IC}$ of 0.01 mA as in the conventional SRAM with power-cut function. Since the P channel MOS transistor Q6 of the stand-by driver circuit 4 has a current supply capability enough to supply a current of 0.5 mA, the internal power source voltage $V_{INT}$ can be maintained at the reference voltage $V_{REF}$ of 4V by only the stand-by driver circuit 4. On the other hand, since the internal power source voltage $V_{INT}$ does never become lower than the reference voltage $V_{REF}$, the control signal S2 which is the output of the differential amplifier 8A of the determination circuit 8 is kept in H level, so that one of the inputs of the 2-input NAND gate 11, that is, the control signal CST, is H level and the other, that is, the inverted control signal S2, becomes L level. As a result, the control signal output S3 of the stand-by mode determination circuit 8 becomes L level. Therefore, the compensating driver circuit 9 is not activated by the control signal S3, consuming no current ($I_{Q25}=0$). That is, the stand-by power source current of the embodiment in ISB1 mode is restricted to 0.9 mA which is very close to the stand-by power source current of 0.8 mA in the conventional SRAM with power-cut function. The excess current of 0.1 mA in the embodiment corresponds to current $I_{Q31}$ consumed by the differential amplifier circuit 8A of the mode determination circuit 8.

Contrary to this, since it is estimated that current (stand-by internal power source current) flowing through the internal circuit 1 in ISB mode is increased to about 20 mA ($=I_{IC}+\Delta I_{IC}$), the stand-by power source current of the whole SRAM is increased. However, since the current supply capability of the standby driver circuit 4 is limited to 0.5 mA as mentioned above, the internal power source voltage $V_{INT}$ becomes lower than the reference voltage $V_{REF}$. Therefore, the output control signal S2 of the differential amplifier circuit 8A of the determination circuit 8 becomes L level. As a result, both the two inputs to the NAND gate 11, that is, the control signal CST and the inverted control signal S2, become H level and therefore, the output S3 of the determination circuit 8 becomes H level. Thus, the compensating driver circuit 9 is activated by the high level signal S3 to make, together with the stand-by driver circuit 4, the internal power source voltage $V_{INT}$ equal to the reference voltage $V_{REF}$ by supplying the increased stand-by internal circuit current $\Delta$Iic of 20 mA. At this time, current $I_{Q25}$ flowing through the N channel MOS transistor Q25 of the differential amplifier circuit 4A of the compensating driver circuit 4 becomes 3.4 mA. Therefore, stand-by power source current when the SRAM of this embodiment is in ISB mode is a sum of the stand-by power source current of 0.9 mA in ISB1 mode, the standby internal circuit current of 20 mA and current consumption of the compensating driver circuit 4 of 3.4 mA, that is, 24.3 mA.

As mentioned above, in the SRAM of this embodiment, despite of the fact that the first input stage of the internal circuit does not have power-cut function, the internal power source voltage is never lowered during stand-by condition regardless of whether it is ISB1 mode or ISB mode. Further, since, in shifting the mode from ISB1 or ISB mode to active mode, there is no delay due to propagation delay of the control signal CST and/or recovery delay of the internal power source voltage as in the conventional SRAM, there is no degradation of read/write speed.

Since, in this embodiment, the standby power source current in ISB1 mode is about 0.9 mA, it satisfies the requirement of the stand-by power source current rate of 2 mA in ISB1 mode for high speed and low power consumption.

On the contrary, since, in order to eliminate the power-cut function of the conventional SRAM 100 shown in FIG. 1, it is necessary to increase the current supply capability of the stand-by driver circuit 4 to 20 mA and to always flow the current $I_{Q16}$ of 3.7 mA through the N channel MOS transistor Q16 of its differential amplifier circuit 4A, the stand-by power source current in stand-by mode becomes larger than the above mentioned required rate. This fact means that, in the conventional SRAM, it is practically impossible to eliminate the power-cut function.

In the described embodiment, it is possible to use a single differential amplifier circuit for those (8A and 4A) of the determination circuit 8 and the stand-by driver circuit 4 to thereby simplify the construction of the determination circuit 8. That is, since the gate input of the P channel MOS transistor Q6 is substantially equal to the control signal S2 in the determination circuit 8, the control signal S2 can be used as the gate input of the transistor Q6. In such case, although the circuit design of the driver circuit 4 may become complicated a little, current flowing through the determination circuit 8 and an area of the chip occupied by the circuit 8 can be reduced.

Although the present invention has been described as applied to the SRAM, it can be applied to DRAM. In the latter case, RAS and signal synchronized therewith should be used instead of the control signals CE and CSB, respectively.

Although the present invention has been described with reference to specific embodiments, this description is not meant to be construed in a limiting sense. Various modifications of the disclosed embodiments, as well as other embodiments of the present invention, will become apparent to persons skilled in the art upon reference to the description of the present invention. It is therefore contemplated that the appended claims will cover any modifications or embodiments as fall within the true scope of the present invention.

What is claimed is:

1. A single chip semiconductor memory operable in either active mode or stand-by mode in response to an external control signal, said semiconductor memory comprising:
    a voltage drop circuit formed on said semiconductor memory chip for stepping an external power source voltage down to a predetermined voltage and supplying the predetermined voltage to an internal circuit as an internal power source voltage for said memory; and
    a control circuit formed on said semiconductor memory chip and responsive to a result of a comparison between said internal power source voltage and said predetermined voltage for controlling an amount of current supply of said voltage drop circuit to said internal circuit in stand-by mode so that said internal power source voltage becomes equal to said predetermined voltage.

2. The single chip semiconductor memory claimed in claim 1, wherein said voltage drop circuit comprises:
    a reference voltage generator circuit for generating a reference voltage corresponding to said predetermined voltage;
    a first driver circuit, said first driver circuit always being in an activated condition for generating said internal power source voltage by stepping said external power source voltage down to a voltage equal to said reference voltage;
    a second driver circuit, said second driver circuit being activated in response to a first auxiliary control signal synchronized with said control signal for generating said internal power source voltage by stepping said external power source voltage down to a voltage equal to said reference voltage; and
    a third driver circuit, said third driver circuit being activated in response to a second auxiliary control signal for generating said internal power source voltage by stepping said external power source voltage down to a voltage equal to said reference voltage.

3. The single chip semiconductor memory claimed in claim 2, wherein said first driver circuit has a current supply capability which is enough to supply a current to said internal circuit in stand-by mode when all input signals to said semiconductor memory are DC signals in an MOS level;
    wherein said second driver circuit has a current supply capability enough to supply, together with said first driver circuit, a maximum operating internal circuit current in said active mode of said semiconductor memory; and
    wherein said third driver circuit has a current supply capability which is enough to supply, together with said first driver circuit, current to said internal circuit in stand-by mode when all input signals to said semiconductor memory are in a TTL level.

4. The single chip semiconductor memory claimed in claim 2, wherein said control circuit comprises a differential amplifier circuit for amplifying a difference between said reference voltage and said internal power source voltage, and means responsive to an output of said differential amplifier and said first auxiliary control signal for producing said second auxiliary control signal.

5. The single chip semiconductor memory claimed in claim 2, wherein said control circuit comprises means for producing a logical product of an inverted signal of a gate voltage control signal of a MOS transistor included in said first driver circuit and an inverted signal of said first auxiliary control signal.

6. The single chip semiconductor memory claimed in claim 2, wherein at least a first input stage of said internal circuit is constructed with a MOS inverter.

* * * * *